United States Patent
West et al.

(10) Patent No.: US 9,299,586 B1
(45) Date of Patent: Mar. 29, 2016

(54) PROCESS FOR MANUFACTURING A COMBINATION ANTI-THEFT AND TRACKING TAG

(71) Applicant: Checkpoint Systems, Inc., Thorofare, NJ (US)

(72) Inventors: George West, Aston, PA (US); Takeshi Matsumoto, Kanagawa (JP); Kenichiro Uemizu, Kanagawa (JP)

(73) Assignee: CHECKPOINT SYSTEMS, INC., Thorofare, NJ (US)

( * ) Notice: Subject to any disclaimer, the term of this patent is extended or adjusted under 35 U.S.C. 154(b) by 0 days.

(21) Appl. No.: 14/495,359

(22) Filed: Sep. 24, 2014

(51) Int. Cl.
*H01L 49/02* (2006.01)
*H01L 21/3213* (2006.01)
*G06K 19/077* (2006.01)
*H01L 21/312* (2006.01)

(52) U.S. Cl.
CPC .... *H01L 21/32133* (2013.01); *G06K 19/07775* (2013.01); *H01L 21/312* (2013.01); *H01L 28/60* (2013.01)

(58) Field of Classification Search
CPC .......................... H01L 21/0226; H01L 28/88
See application file for complete search history.

(56) References Cited

U.S. PATENT DOCUMENTS

| | | | |
|---|---|---|---|
| 5,939,984 A | 8/1999 | Brady et al. | |
| 6,154,137 A | 11/2000 | Goff et al. | |
| 7,109,867 B2 | 9/2006 | Forster | |
| 7,804,407 B2 | 9/2010 | Copeland | |
| 7,804,410 B2 | 9/2010 | Copeland | |
| 7,804,411 B2 | 9/2010 | Copeland | |
| 7,812,729 B2 | 10/2010 | Copeland | |
| 8,026,818 B2 | 9/2011 | Cote et al. | |
| 8,093,996 B2 | 1/2012 | Heurtier | |
| 8,633,821 B2 | 1/2014 | Forster | |

FOREIGN PATENT DOCUMENTS

| | | |
|---|---|---|
| EP | 2096582 A1 | 9/2009 |
| FR | 2901041 A1 | 11/2007 |

OTHER PUBLICATIONS

Extended Search Report and Written Opinion of corresponding EP application No. 15186493.1 mailed Jan. 1, 2016.

*Primary Examiner* — Cheung Lee
(74) *Attorney, Agent, or Firm* — Nelson Mullins Riley & Scarborough LLP

(57) ABSTRACT

Manufacturing antennas for a dual tag by: providing a web structure having a dielectric layer between a first metal layer and a second metal layer; depositing a first resist on the first metal layer to define a radio frequency (RF) coil and a first electrode of an RF capacitor; depositing the first resist on the second metal layer to define a second electrode of the RF capacitor; depositing a second resist on the second metal layer to define connection pads for a near field antenna, wherein one of the first resist and the second resist on the second metal layer defines a far field antenna and the near field antenna; and etching the first and second metal layers to form the RF coil, the electrodes of the RF capacitor, the far field antenna, the near field antenna, and the connection pads.

20 Claims, 8 Drawing Sheets

PROCESS FOR MANUFACTURING A COMBINATION ANTI-THEFT AND TRACKING TAG

FIELD OF THE INVENTION

The field of the present invention relates to processes for manufacturing security tags, including security tags incorporating both anti-theft features and tracking features.

BACKGROUND OF THE INVENTION

Some of the major concerns of warehouse and store managers regarding the flow of merchandise include its protection against theft, including thefts at points of sale, and its traceability (namely, its identification, location, and movement).

Nowadays more and more anti-theft labels are incorporated into an article during its manufacture or packaging, based on the principle of source tagging. Applying the anti-theft element at the source (i.e., during the manufacture or packaging of the article), eliminates the need to apply it at other stages in the commercial life of the product.

Several types of EAS (Electronic Article Surveillance) systems exist on the market. The two biggest-selling systems worldwide are the radio-frequency (RF) anti-theft system, with a coil or closed-loop antenna operating between 5 and 8.2 MHz, and the acoustic-magnetic (AM) system with an element operating at 58 KHz. Both types of EAS systems make use of EAS tags attached to merchandise.

The EAS tags transmit back a signal resonating through an antenna when the EAS tags travel through an alternative magnetic field having a frequency which coincides with the antenna resonance frequency. Such alternative magnetic fields may be supplied by terminals at store exits, for example. In the current state of the art, the signal transmitted back by the EAS tag does not include any identifier.

For remote identification and location of an object, object identification is possible through the use of radio-frequency identification (RFID) systems. These systems include a reader and a transponder. The reader comprises a radio wave and a magnetic field transmitter that communicates with a transponder (transmitter-receiver) located within its reading field. The transponder comprises an integrated circuit, with or without a memory, and an antenna.

RFID is increasingly used to ensure the proper monitoring of objects or of consumer goods. To this end, a transponder comprising an antenna and an integrated circuit is applied on the article or object to be tracked. The antenna is designed so that its inductance has a specific value such as to form a resonant circuit with the integrated circuit capacitance. The transponder communicates with receivers or readers whose transmitting power and operating frequency range must be adapted to the requirements of the laws and regulations in force in different countries.

For many goods in which anti-theft and tracking is desired, only the EAS element is applied at the source; the UHF element is added at a later stage in the distribution chain. Significant savings in the distribution chain could result from applying the EAS element and the UHF element to the same tag at the source. Additional advantages may be realized in the manufacturing processes for a dual tag, as described herein. Costs in material and labor may be reduced, for example, by taking advantage of similarities between fabrication processes for both the EAS and UHF antennas. In addition, cost savings may be realized by manufacturing a dual tag which is reduced in size. Dual tags manufactured by the fabrication process described below enable a small tag that also maintains a high performance level.

SUMMARY OF THE INVENTION

The present invention is directed toward a process for manufacturing a combination anti-theft and tracking tag. The tag includes an RF antenna for use with an anti-theft system, and an antenna for use with a tracking system.

In a first separate aspect of the present invention, a process for manufacturing antennas for a dual tag includes: providing a web structure having a dielectric layer between a first metal layer and a second metal layer; depositing a first resist on the first metal layer, wherein deposition of the first resist on the first metal layer defines a radio frequency (RF) coil and a first electrode of an RF capacitor; depositing the first resist on the second metal layer; depositing a second resist on the second metal layer, wherein deposition of the first resist on the second metal layer defines a second electrode of the RF capacitor, deposition of one of the first resist and the second resist on the second metal layer defines a far field antenna and a near field antenna, and deposition of the second resist on the second metal layer defines connection pads for the near field antenna; etching the first and second metal layers to form the RF coil, the RF capacitor, the far field antenna, the near field antenna, and the connection pads; and removing the second resist.

In a second separate aspect of the present invention, a process for manufacturing a dual tag includes: providing a web structure having a dielectric layer between a first metal layer and a second metal layer; depositing a first resist on the first metal layer, wherein deposition of the first resist on the first metal layer defines an RF coil and a first electrode of an RF capacitor; depositing the first resist on the second metal layer; depositing a second resist on the second metal layer, wherein deposition of the first resist on the second metal layer defines a second electrode of the RF capacitor, deposition of one of the first resist and the second resist on the second metal layer defines a far field antenna and a near field antenna, and deposition of the second resist on the second metal layer defines connection pads for the near field antenna; etching the first and second metal layers to form the RF coil, the electrodes of the RF capacitor, the far field antenna, the near field antenna, and the connection pads; removing the second resist; operably coupling the RF capacitor to the RF coil; adhering a base layer over the first metal layer side of the web structure; dimpling the dielectric between the first and second electrodes of the RF capacitor; operably affixing a radio frequency identification (RFID) element to the connection pads; cutting partially around the formed RF capacitor; folding the RF capacitor onto the second metal layer side of the web structure; and adhering a liner over the second metal layer side of the web structure.

In a third separate aspect of the present invention, a process for manufacturing antennas for dual tags includes: providing a web structure having a dielectric layer between a first metal layer and a second metal layer; defining a plurality of tag areas across the web structure, each tag area separated from other tag areas by a web matrix area, and within each tag area: depositing a first resist on the first metal layer, wherein deposition of the resist on the first metal layer defines a radio frequency (RF) coil and a first electrode of an RF capacitor; depositing the first resist on the second metal layer; and depositing a second resist, which is easier to remove than the first resist, on the second metal layer, wherein deposition of the first resist on the second metal layer defines a second electrode of the RF capacitor, deposition of one of the first resist and the second resist on the second metal layer defines a far field antenna and a near field antenna, and deposition of the second resist on the second metal layer defines connection pads for the near field antenna; depositing the first resist over portions of the web matrix area to define peripheral structure around each of the tag areas, wherein separation lines are formed without the first resist over the web matrix area, the separation lines delineating between adjacent ones of the tag areas; etching the first and second metal layers to form individual tags, each individual tag including the RF coil, the RF capacitor, the far field antenna, the near field antenna, the connection pads, and the peripheral structure; and removing the removable resist.

Accordingly, an improved process for manufacturing a combination anti-theft and tracking tag is disclosed. Advantages of the improvements will be apparent from the drawings and the description of the preferred embodiment.

BRIEF DESCRIPTION OF THE DRAWINGS

The foregoing summary, as well as the following detailed description of the exemplary embodiments, will be better understood when read in conjunction with the appended drawings. It should be understood, however, that the invention is not limited to the precise arrangements and instrumentalities shown in the following figures.

DETAILED DESCRIPTION OF THE INVENTION

Figure 1:
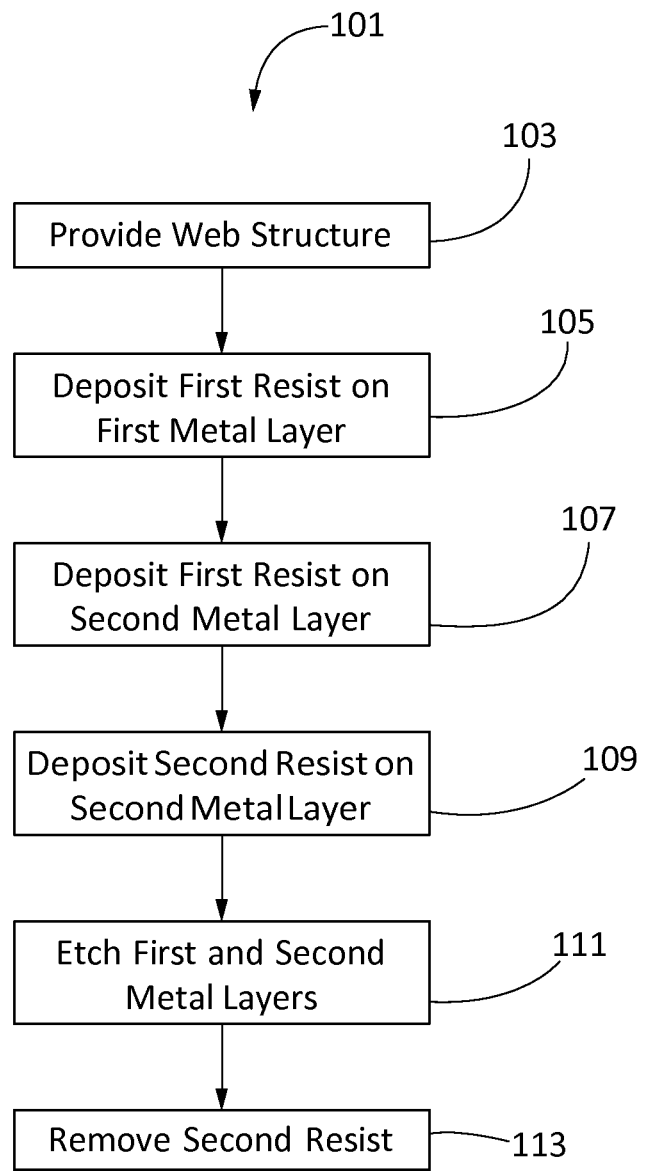
FIG. 1 is a flowchart showing steps in the process of manufacturing antennas for a dual tag.

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "left," "right," "top" and "bottom" as well as derivatives thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such.

Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the preferred embodiments. Accordingly, the invention expressly should not be limited to such preferred embodiments illustrating some possible non-limiting combinations of features that may exist alone or in other combinations of features; the scope of the invention being defined by the claims appended hereto.

Figure 2A:
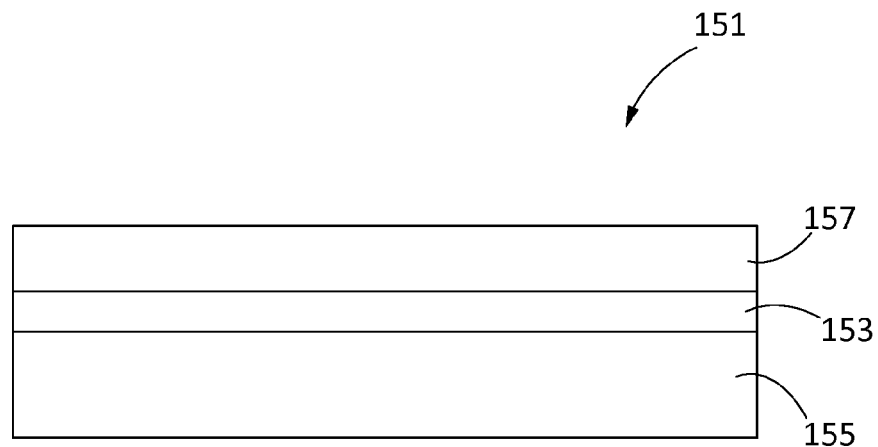
FIG. 2A shows a cross section of a web structure.

FIG. 1 depicts a flow chart 101 showing steps for fabricating antennas for a dual tag, according to an exemplary embodiment. The steps outlined in FIG. 1 are described in conjunction with the structures shown in FIGS. 2A-B. In a first step 103, a web structure 151 (shown in FIG. 2A) is provided or fabricated. The web structure 151 includes a dielectric layer 153 positioned between a first metal layer 155 and a second metal layer 157. In the embodiment shown, the first metal layer 155 has a first thickness and the second metal layer 157 has a second thickness, with the first thickness being greater than the second thickness. The actual thicknesses of, and any difference in thicknesses between, the first and second metal layers 155, 157 may vary, however. Such variations may depend, for example, upon factors including the frequency requirements of the antennas to be formed from the web structure, desired rigidity of the dual tag, design choices made for the tag, design choices which affect subsequent steps of the dual tag fabrication process, as well as other factors. Further, in certain embodiments, the thickness of the first and second metal layers may be the same.

In certain embodiments, the dielectric layer 153 may be formed from cast polypropylene (CPP), polyethylene (PE), oriented polypropylene (OPP), or another type of dielectric material that is suitable for the particular implementation of a dual tag. The first and the second metal layers 155, 157 may be formed from aluminum. Other materials may be used for the respective layers, however, with the understanding that a part of the metal-dielectric-metal web is to be used to form a capacitor, and parts of each of the metal layers are to be used to form antennas. In embodiments in which these elements are formed for a dual tag, the materials selected for the web structure need to enable the functionality of these elements for the resulting dual tag.

The thickness of the dielectric layer 153 may vary. In some embodiment, the thickness of the dielectric layer may be a factor in the operational frequencies of the RF capacitor formed from the web structure 151 of the dual tag. In certain embodiments, for example, the dielectric layer 153 may be very thin. A thin dielectric layer 153 allows very small RF circuits, which are operational at 8.2 MHz, to be manufactured. The choice of materials for the dielectric layer and the thickness of the dielectric layer are two exemplary factors, in addition to other factors, which contribute to the operational frequency of the resulting RF circuit.

With the provision of, or in some embodiments, fabrication of, the web structure 151 in the first step 103, fabrication of the antennas may proceed by deposition of one or more types of resist material on the first metal layer 155 and/or the second metal layer 157. These resist deposition steps may be performed in any desired order. Further, the resist deposition steps may be performed concurrently, e.g., if the same resist material is used in two or more of the deposition steps.

Figure 2B:
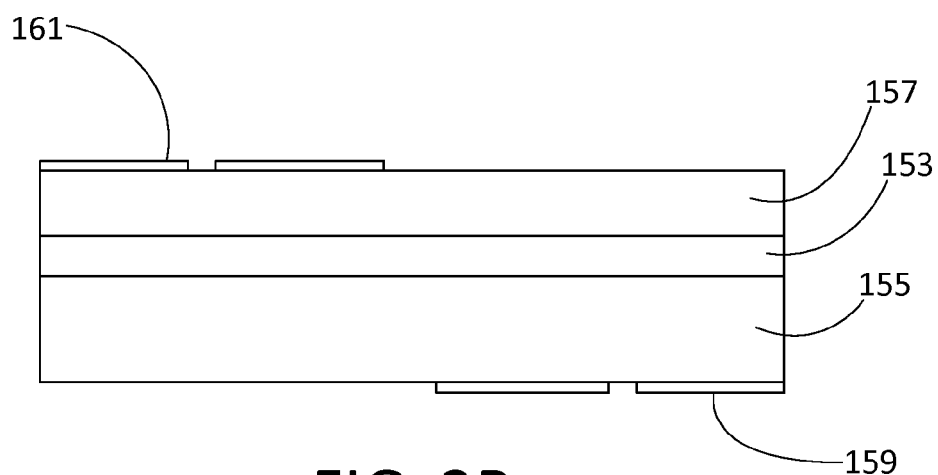
FIG. 2B shows a cross section of the web structure of FIG. 2A after application of a resist to the metal layers.

In one resist deposition step 105, a first resist 159 is deposited on the first metal layer 155. Deposition of this first resist on the first metal layer 155 may define an RF coil and a first electrode of an RF capacitor, both of which may be formed from the first metal layer 155. An exemplary web structure 151 with resist 159, 161 deposited on the first and second metal layers 155, 157 is shown in FIG. 2B.

In another resist deposition step 107, the first resist 159 is deposited on the second metal layer 157. Deposition of the first resist 159 on the second metal layer 157 may define a second electrode of the RF capacitor which is to be formed from the second metal layer 157. In yet another resist deposition step 109, a second resist 161 is deposited on the second metal layer 157. Deposition of the second resist 161 on the second metal layer 157 may define connection pads for a near field antenna, so that the connection pads are formed from the second metal layer 157. The near field antenna and the far field antenna may also be formed from the second metal layer 157. The first resist 159, or the second resist 161, may be used to define the near field antenna and/or the far field antenna.

In certain alternative embodiments, deposition of the first resist on the first metal layer 155 may define one, or both, of the far field antenna and the near field antenna. In alternative embodiments, one or both of the far field antenna and the near field antenna, respectively, may be formed from deposition of the second resist on the second metal layer. In embodiments where the far field antenna and the near field antenna are formed on different metal layers, they may be operationally connected at a later stage of the process.

In certain embodiments, the first resist 159 and the second resist 161 may be different types of resist material. In such embodiments, each resist may be removable by different removal processes. For example, the first resist 159 may be one type of resist material, removable by a first type of removal process, and the second resist 161 may be a second type of resist material that is removable by a second type of removal process. In such an embodiment, the removal process for the second resist 161 may not remove the first resist 159.

The first resist 159, for example, may be a resist (e.g., a solvent-based resist) that is not easily removed, and the second resist 161 may be a resist that is more easily removed than the first resist 159. In one embodiment, the first resist 159 may be used to form the far field antenna 191 and/or the near field antenna 189. In this example, the second resist 161 may be used such that a portion (i.e., the arms) of the connection pads 193 may be removed. Because the second resist 161 is more easily removed than the first resist 159, a portion (e.g., the arms) of the connection pads 193 may be removed while the far field antenna 191 and/or the near field antenna 189 are retained.

After the portion of the connection pads 193 is removed, the IC chip may be adhesively attached to the near field antenna 189. Further, once the IC chip is adhesively attached to the connection pads 193, heat and/or pressure may be used to cure the adhesive, thus creating a strong bond between the IC chip and the connection pads 193. To provide additional strength for IC chip attachment to the near field antenna 189, a structure 195 may be formed from the first metal layer 159 or the second metal layer 157. In a preferred embodiment, shown on FIG. 3B, the structure 195 may be formed from a metal layer that opposes the metal layer from which the near field antenna 189 is formed. For example, if the near field antenna 189 is formed from the second metal layer 157, the structure 195 may be formed from the first metal layer 159 (or, vice versa). In other embodiments, however, the structure 195 may be formed from the same metal layer from which the near field antenna 189 is formed.

The structure 195 may further be positioned such that at least a portion of the structure 195 overlaps the connection pads 193. The structure 195, being positioned in such a manner, may provide functionality in addition to, or distinct from, providing increased strength for chip attachment. The structure 195, for example, may be used to cause heat presented during the IC chip attachment process to dissipate. Thus, in this embodiment, rather than allowing the heat applied during chip attachment to be concentrated on one area (e.g., the near field antenna 189 area), the structure 195 may enable the heat presented during IC chip attachment to dissipate throughout the structure 195, or, even, throughout the web structure 151.

In certain other embodiments, the first resist 159 and the second resist 161 may be the same resist material. In embodiments wherein the first resist 159 and the second resist 161 are the same, all the resist material may be removed in a single removal step. In still other embodiments, the first resist 159 may be deposited only on the first metal layer 155, while the second resist is deposited only on the second metal layer 157.

One, or both, of the first resist 159 and the second resist 161 may be a printable resist material, such that one or more of the deposition steps 105, 107, 109 may include printing the first or second resist onto the respective first or second material layers 155, 157. In such an embodiment, the first resist may be a resist ink that prints the far field antenna and/or the near field loop antenna. In some embodiments, the first resist may print the far field antenna and the near field loop antenna at the same time. The first resist material may be printed onto one or both of the first or second material layers 155, 157, and the second resist material may be a resist ink that is more easily removed than the first resist. The second resist may be used, for example, to remove a portion of the connection pads 193, while the first resist may be used so that the near field antenna and the far field antenna are retained.

Following the depositing steps 105, 107, 109 is an etching step 111. In step 111, the first and second metal layers 155, 157 are etched in a process to remove metal not covered by resist. With the etching step 111, the RF coil, the RF capacitor, the far field antenna, the near field antenna, and the connection pads are all formed by the metal of the first and second metal layers covered by resist. In a removing step 113, the resist on at least the connection pads is removed, thereby enabling an RFID element to be electrically coupled to the connection pads, and thus to the near field antenna. The resist on the connection pads 193 may be removable due to the resist deposited on the connection pads 193 being easier to remove than the first resist. The intermediary web structure, which includes multiple antennas formed by the steps 103-113 shown in FIG. 1, is suitable for fabricating into a dual tag.

In certain embodiments, the far field antenna is formed as a UHF far field dipole antenna, which may be configured with an appropriate operational range. In some embodiments, an operational range for the UHF far field dipole antenna may be at resonant frequencies ranging from 0.8 to 2.5 GHz. In certain embodiments, the near field antenna is formed as a UHF near field loop antenna, which may be configured with an appropriate operational range. In some embodiments, an operational range for the UHF near field loop antenna may be at resonance frequencies ranging from 0.8 to 2.5 GHz. In other embodiments, the UHF far field dipole antenna and the UHF near field antenna are configured with the same operational range. In the exemplified embodiment, the near field loop antenna and the far field dipole antenna are physically isolated. In alternative embodiments, these antennas may be connected.

In certain alternative embodiments, rather than depositing resist and etching the first metal layer to form the RF coil from the first metal layer (and any other operational elements to be formed from the first metal layer), the RF coil may be formed by die cutting at a later step in the dual tag fabrication process. In other alternative embodiments, rather than depositing resist and etching the second metal layer, one or more of the far field antenna, the near field antenna, and the connection pads may be formed by die cutting in a later step in the dual tag fabrication process. Since a later step in the dual tag fabrication process may include die cutting, processing one of the first metal layer or the second metal layer, to form the antennas or other elements therefrom, respectively, may introduce efficiencies in the dual tag fabrication process that are not available in the consolidated deposition and etching processes described above.

Figures 3A, 3B:
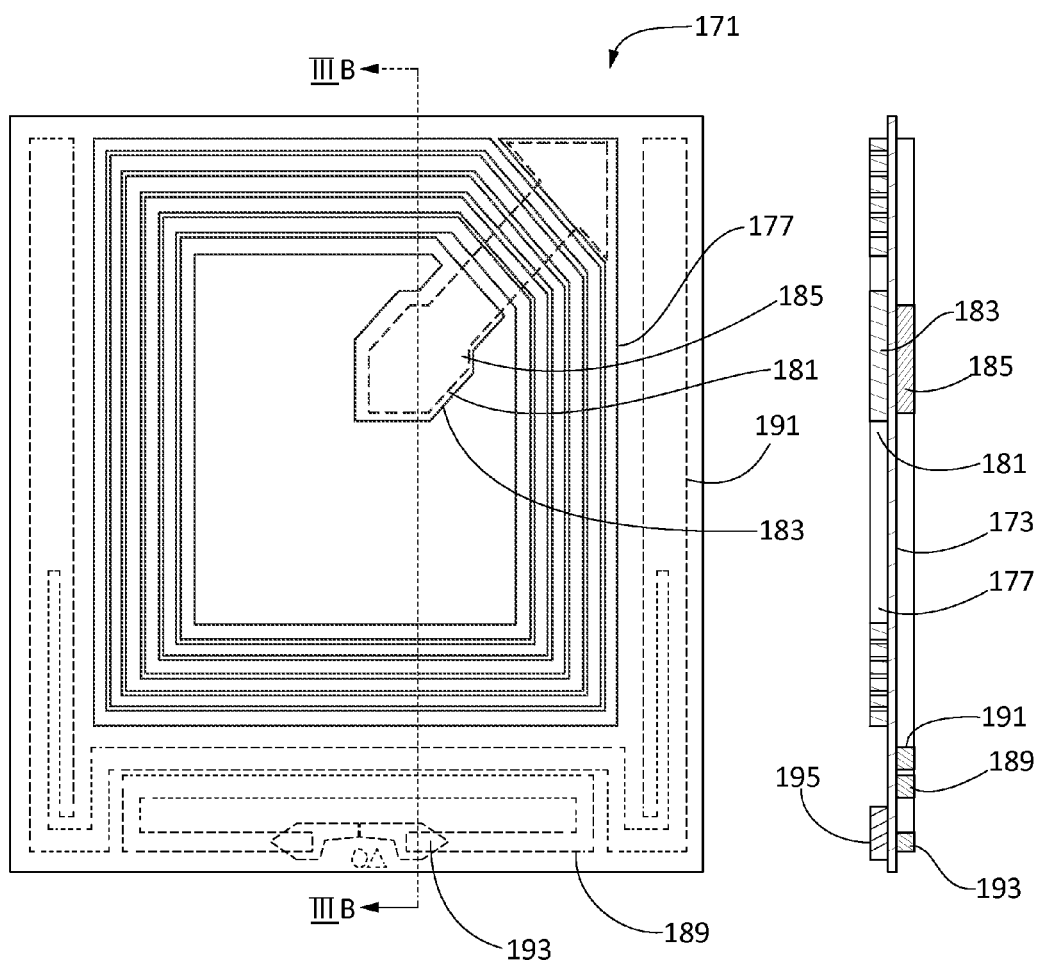
FIG. 3A shows a top elevation view of a first embodiment of an intermediary web structure with antennas formed thereon.
FIG. 3B shows a cross section of the intermediary web structure of FIG. 3A.

An embodiment of an intermediary web structure 171 having etched antennas is shown in FIGS. 3A-B. The etched web structure 171 includes an RF coil 177 etched from the first metal layer; an RF capacitor 181 having first and second electrodes 183, 185 etched, respectively, from the first and second metal layers with the dielectric layer 173 therebetween; a near field antenna 189 etched from the second metal layer; a far field antenna 191 etched from the second metal layer; and connection pads 193 etched from the second metal layer. Although FIGS. 3A-B depict the RF coil etched from the first metal layer, and the near field loop antenna 189 and far field antenna 191 etched from the second metal layer, it should be understood that the configuration of these elements can be various, according to embodiments of the dual tag described herein.

Figure 4:
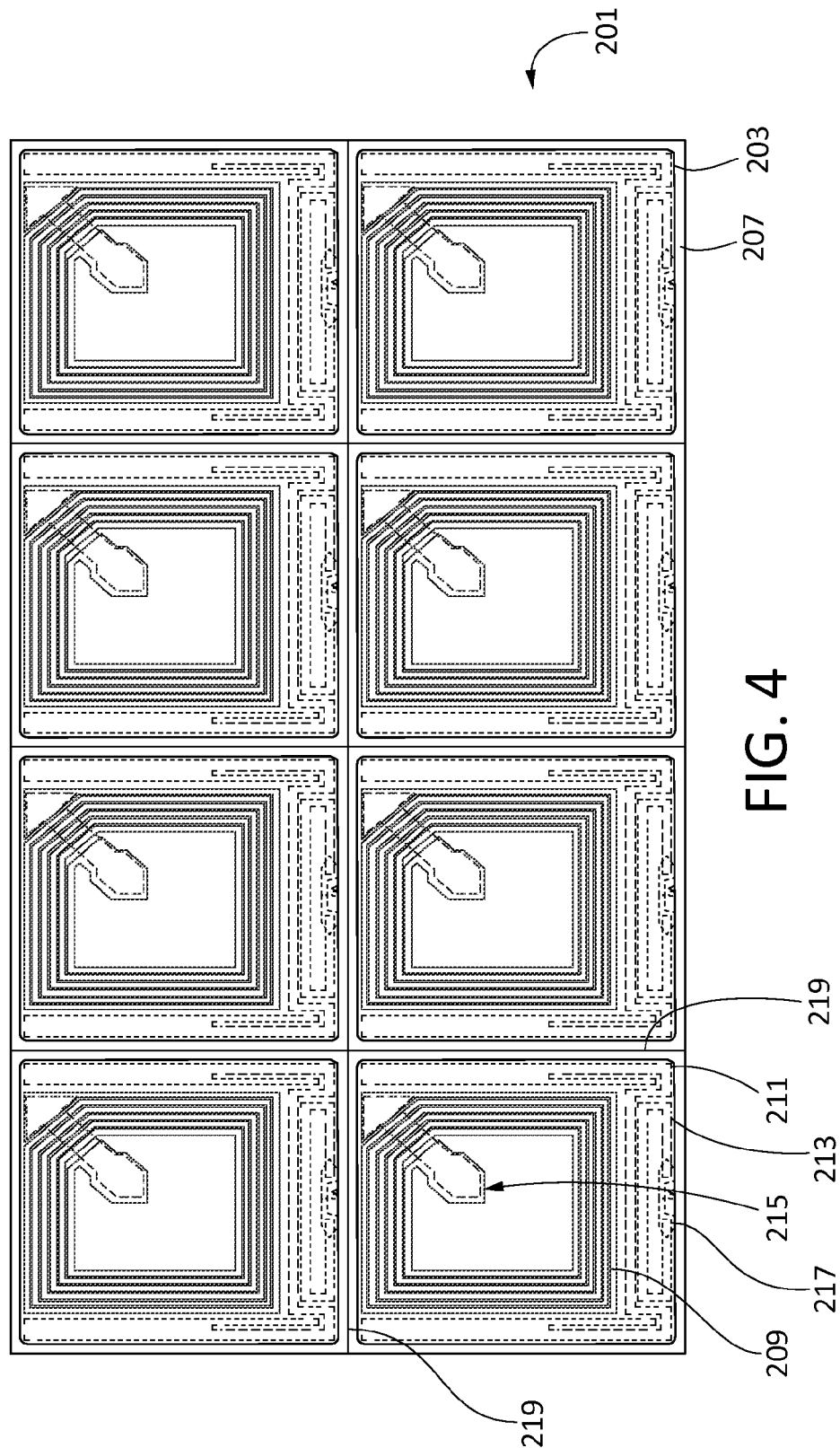
FIG. 4 shows a top elevation view of a web structure having a plurality of tag areas formed thereon, each tag area having antennas.

FIG. 4 shows a web structure 201 having a dielectric layer between first and second metal layers (the separate layers are not shown in FIG. 4), as described above. A plurality of tag areas 203 are defined across the web structure 201 by deposited resist, with each tag area 203 being separated from the other tag areas 203 by a web matrix area 207. A plurality of intermediary web structures may be obtained from this web structure 201 once the tag areas 203 are separated from one another. Each tag area 203 has resist deposited to form antennas 209, 211, 213, an RF capacitor 215, and connection pads 217 in the manner described above.

As shown in FIG. 4, the antennas 209, 211, 213 may be formed on opposite sides of the web structure 201 within each tag area 203, as described above. The web matrix area 207, on one or both sides of the web structure 201, may further be deposited with resist to define a peripheral structure in one or both of the first and second metal layers. The peripheral structure may be formed around each tag area 203. The inclusion of the peripheral structure may help provide additional rigidity to the resulting dual tag that is fabricated. For example, the peripheral structure may be defined in the first metal layer, the second metal layer, or both first and second metal layers around the RF coil and the first electrode of the RF capacitor defined in the first metal layer, the second electrode of the RF capacitor, the far field antenna, the near field antenna, and/or the connection pads defined in the second metal layer. Once the etching step is completed, before or after removal of resist, the tag areas 203 may be separated from one another to obtain a plurality of intermediary web structures.

In certain embodiments, the web matrix area 207 is as wide as the desired peripheral structures to be formed around the resulting intermediary web structure, so that when the adjacent tag areas are separated, each resulting intermediary web structure includes substantially the same peripheral structure. To this end, the web matrix area 207 may have resist deposited over nearly all portions of one or both of the first and second metal layers, with the exception of separation lines 219, which define where one tag area 203 is to be separated from an adjacent tag area. In certain embodiments, where one of the metal layers has a greater thickness than the other metal layer, the separation lines 219 may be formed at least in the thicker of the two metal layers.

The separation lines 219 provide the benefit of enabling the various tag areas to be mechanically separated from adjacent tag areas, when the remaining material along the separation lines 219 (either both the second metal layer and the dielectric layer, or just the dielectric layer) is sufficiently thin, by tearing, ripping, or cutting along the separation lines 219. For example, where the first metal layer is the thicker of the two metal layers, separation lines 219 may be etched from the first metal layer, so that when the tag areas are separated from each other along the separation lines 219, the resulting intermediary web structures may have a consistent width in the absence of alignment of a cutting tool. Having a consistent width allows for, among other things, subsequent processes in the fabrication of a dual tag to be optimized. For example, an inconsistent width may result in misaligned chip attach locations, such that the UHF antennas will not function at optimum performance, or possibly be entirely inoperable, if the misalignment is great enough.

Figure 5:
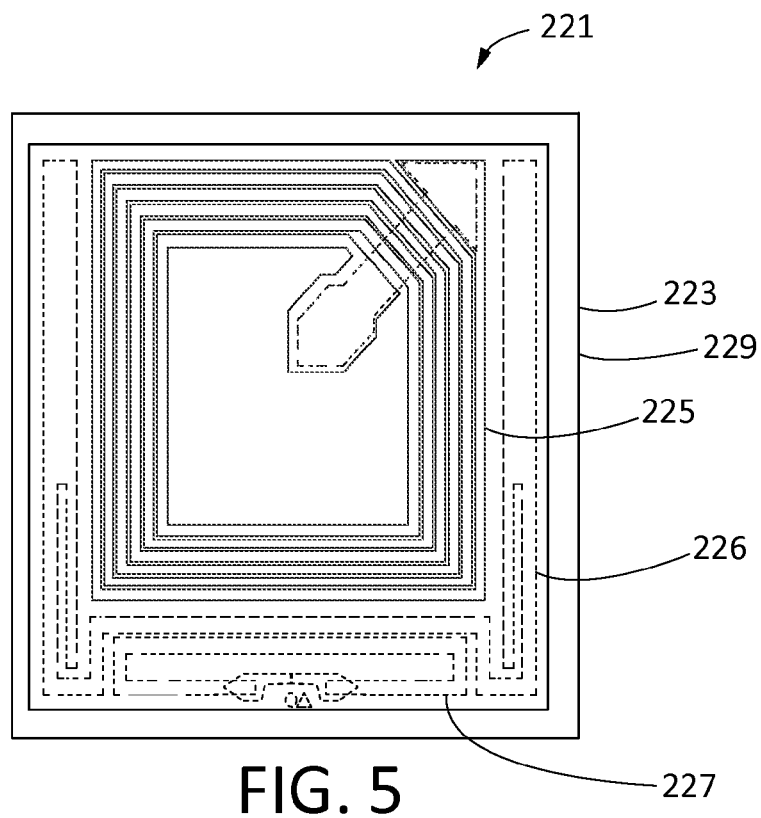
FIG. 5 shows a top elevation view of a second embodiment of an intermediary web structure with antennas formed thereon.

One embodiment of an intermediary web structure 221 having a peripheral structure 223 formed around the antennas 225, 226, 227 is shown in FIG. 5. This peripheral structure 223 is formed as a peripheral wall 229 around the antennas 225, 226, 227 of the intermediary web structure 221. In certain embodiments, the peripheral wall 229 may have a width of between about 2 mm to 8 mm.

Figure 6:
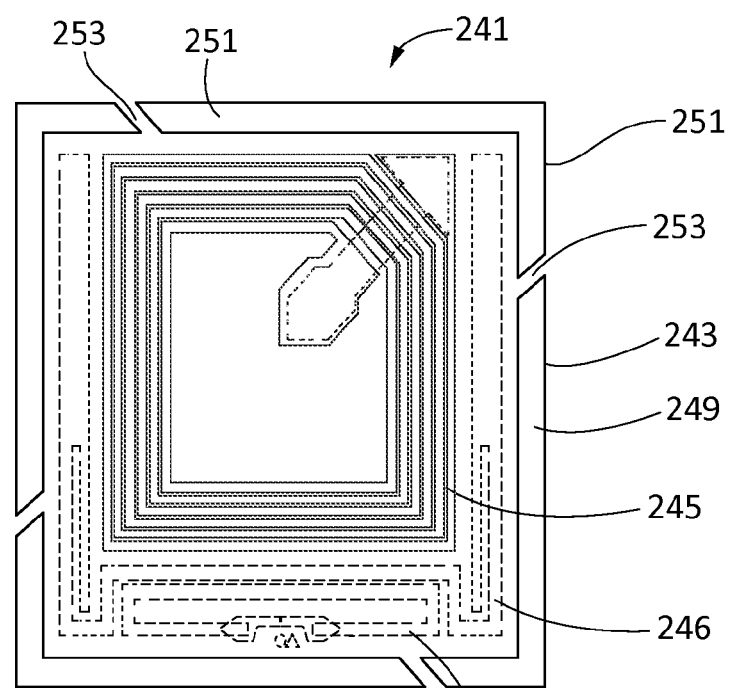
FIG. 6 shows a top elevation view of a third embodiment of an intermediary web structure with antennas formed thereon.

Another embodiment of an intermediary web structure 241 having a peripheral structure 243 formed around the antennas 245, 246, 247 is shown in FIG. 6. This peripheral structure 243 is formed as a peripheral wall 249 around the antennas 245, 246, 247 of the intermediary web structure 241. As shown in FIG. 6, each side 251 of the peripheral wall 249 may include a break 253, although each side 251 may have more than one break, or no breaks. These breaks 253 help to prevent wrinkles in the intermediary web structure 241 when the intermediary web structure 241 is mounted onto a sheet and wound into a master roll. Intermediary web structures wound into a master roll according to his embodiment, therefore, may be easily stored and accessed for further fabrication into dual tags.

Figure 7:
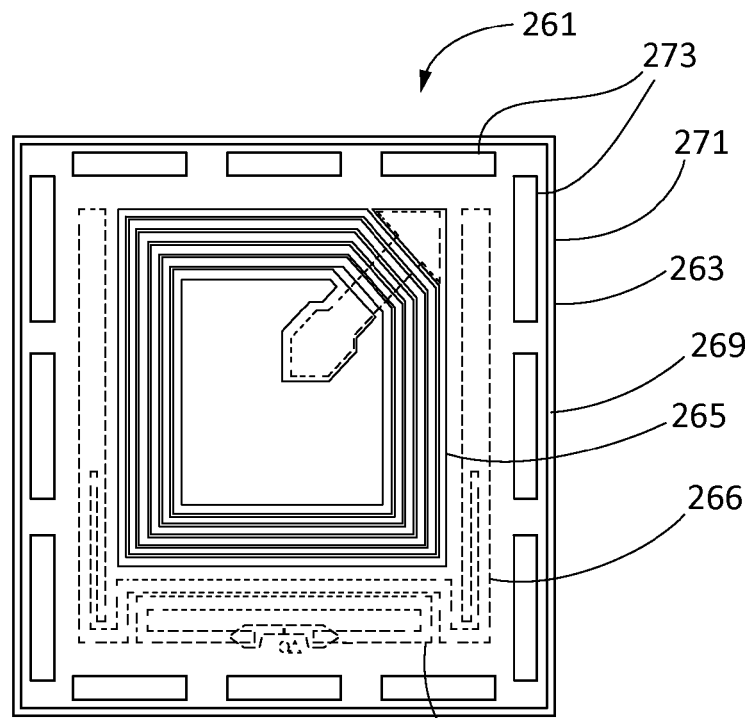
FIG. 7 shows a top elevation view of a fourth embodiment of an intermediary web structure with antennas formed thereon.

Another embodiment of an intermediary web structure 261 having a peripheral structure 263 formed around the antennas 265, 266, 267 is shown in FIG. 7. This peripheral structure 263 is formed as a peripheral wall 269 having a solid wall section 271 and a plurality of spaced-apart blocks 273 around the antennas 265, 266, 267 of the intermediary web structure 261. The solid wall section 271 and the plurality of spaced-apart blocks 273 may be formed in any one or both of the first and second metal layers. The blocks 271 serve to enhance the rigidity of the intermediary web structure 261 and enable the peripheral wall 269 to be fabricated with a width of about 1 mm to 2 mm, for example.

Figure 8:
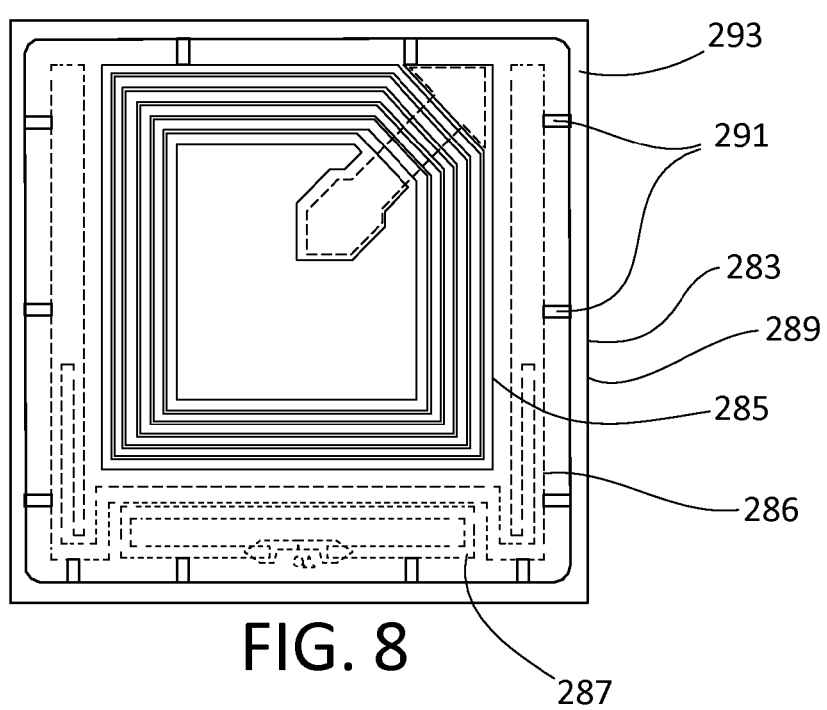
FIG. 8 shows a top elevation view of a fifth embodiment of an intermediary web structure with antennas formed thereon.

Another embodiment of an intermediary web structure 281 having a peripheral structure 283 formed around the antennas 285, 286, 287 is shown in FIG. 8. This peripheral structure 283 is formed as a peripheral wall 289, wherein fingers 291 extend from the inner peripheral surface 293 of the peripheral wall 289 towards the antennas 285, 286, 287. The peripheral wall 289, and the fingers 291, may be formed in any one or both of the first and second metal layers. In certain embodiments, the fingers 291 may connect the far field antenna 286 and/or the near field antenna 287 to the peripheral wall 289.

Figure 9:
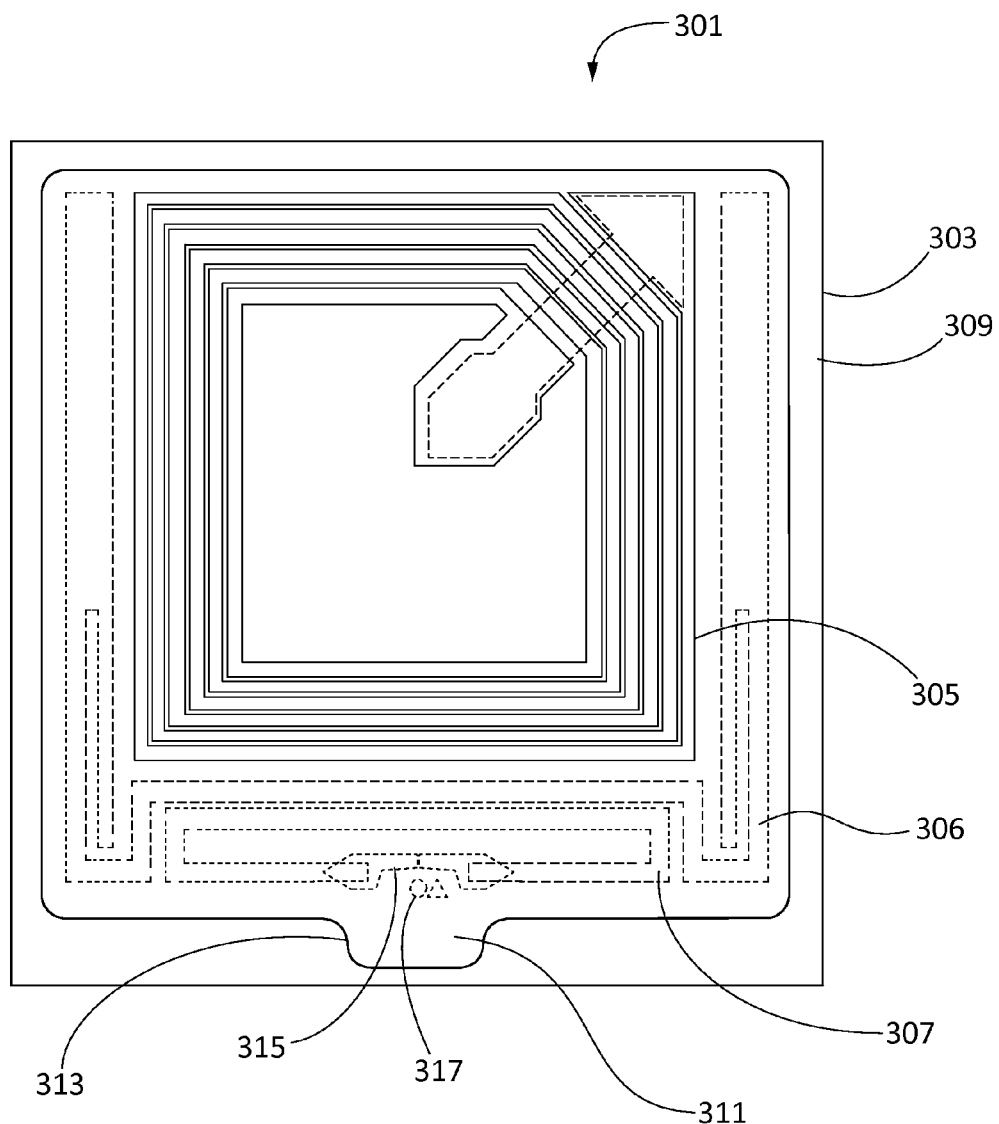
FIG. 9 shows a top elevation view of a sixth embodiment of an intermediary web structure with antennas formed thereon.

Another embodiment of an intermediary web structure 301 having a peripheral structure 303 formed around the antennas 305, 306, 307 is shown in FIG. 9. This peripheral structure 303 is formed as a peripheral wall 309, further including a notched space 311 in an inner surface 313. The notched space 311 is configured so that an RFID element (not shown) may have sufficient room to be mounted to the connection pads 315. In certain embodiments, registration marks 317 may be formed from the second aluminum layer for use in common UHF chip attachment processes.

Figure 10:
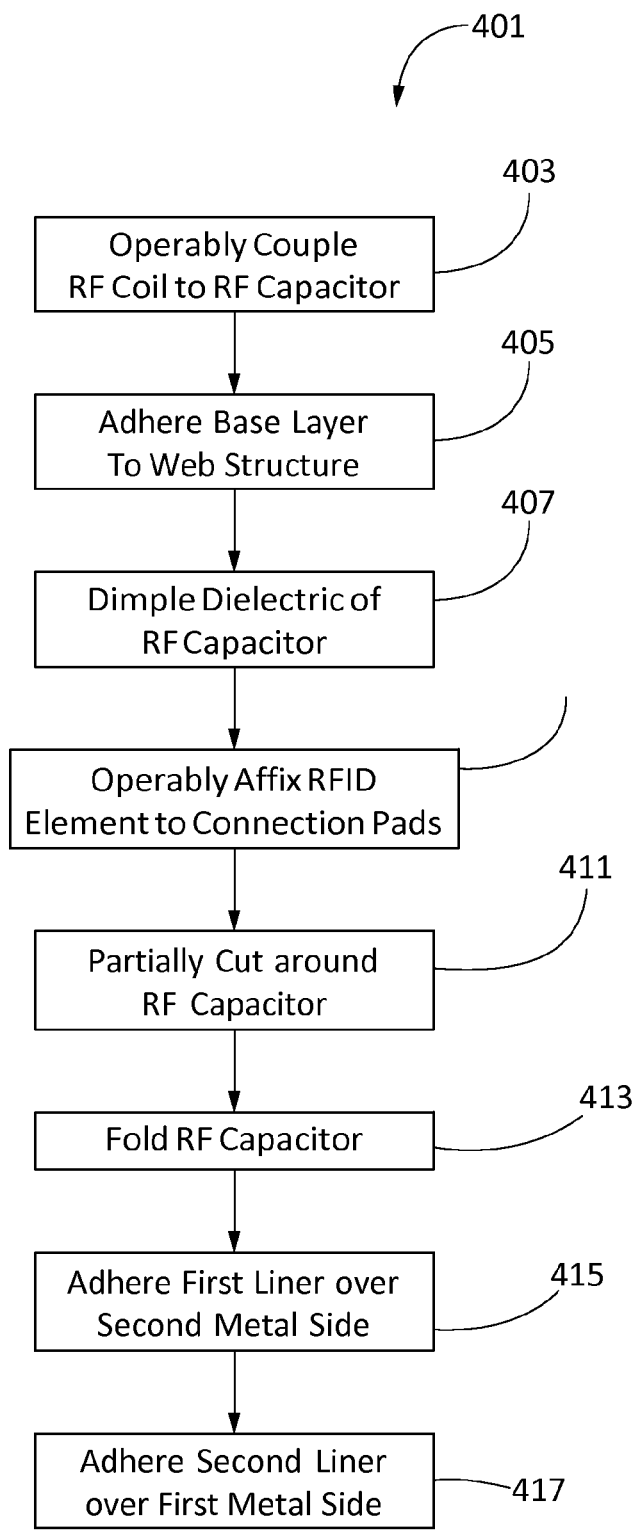
FIG. 10 is a flowchart showing steps in the process of manufacturing a dual tag.

A process for fabricating a dual tag from the intermediary web structure with antennas is shown in the flowchart 401 of FIG. 10. The processes of FIGS. 1 and 10 show the process of fabricating a dual tag from a web structure which is provided or fabricated. Many of these steps may be performed in any order, and those of skill in the art will recognize that by changing the order, some parts of the process in the description below may need to be modified to accommodate the change in order of the process steps. Further, in certain embodiments, the subsequent fabrication steps of FIG. 10 may be performed on a single intermediary web structure, or they may be performed on intermediary web structures that have not yet been separated from each other, such as are shown in FIG. 4.

On the intermediary web structure, the RF capacitor is operably coupled 403 to the RF coil. Also, the near field and far field antennas may also be operably coupled at this stage. Since the first electrode of the RF capacitor and the RF coil are both formed from the first metal layer, these two components may be formed during the deposition and etching steps. To operably connect the RF capacitor to the RF coil, therefore, an electrical connection is made between the second electrode of the RF capacitor, which was formed out of the second metal layer, and the RF coil. The electrical connection may be made using commonly used crimping or welding processes.

Following operably connecting 403 the RF capacitor to the RF coil, a base layer is adhered 405 over the components formed from the first metal layer of the intermediary web structure. In certain embodiments, adhesion of the base layer may include adhering a plastic substrate, such as a polyethylene terephthalate (PET) layer, to the first metal layer. In certain embodiments, the PET layer may be about 50 mm thick. In other embodiments, other materials and/or material thicknesses may be used for the base layer.

The dielectric between the first and second electrodes of the RF capacitor may be dimpled 407 to promote the deactivation of the RF circuit when exposed to a strong electromagnetic field. The dimpling 407 may be a mechanical process in which an indented area is created on one side of first and second metal layers, depending on which of the metal layers was thinnest, and which may already have a base layer, liner, or other layer adhered to or placed thereon. By dimpling the dielectric of the RF capacitor, when the RF circuit is exposed to a strong electromagnetic field, an electrical short forms across the dielectric of capacitor in the indented area, thereby resulting in the RF circuit becoming non-functional.

In a further step, a radio frequency identification (RFID) element is affixed 409 to the connection pads. In certain embodiments, the RFID element includes an IC chip that is tuned to the operable frequency range of the near field and far field antennas. The RFID element IC chip connected to the near field antenna by a direct attach method. An adhesive is used to connect the RFID element to the connection pads. In one embodiment, heat and pressure may be used to cure the adhesive to create a strong bond between the RFID element and the connection pads.

In a further step, the RF capacitor is partially cut around 411 so that it may be subsequently folded over one of the first or second metal layers of the intermediary web structure. In certain embodiments, the cutting may be performed by die cutting around the RF capacitor through the first metal layer, the dielectric layer, the second metal layer, and any adhesive, base layers, and/or liner layers which have been affixed to the intermediary web structure prior to this cutting step. A portion of the periphery around the RF capacitor is not cut so that the RF capacitor remains part of the intermediary web structure and operably coupled to the RF coil. The portion that is not cut is a narrow arm which may be used to form a foldable joint for a subsequent folding step 413.

Once the cutting 411 has been performed, the RF capacitor may be folded 413 along the foldable joint formed in the intermediary web structure. The RF capacitor may be mechanically folded back, along the narrow arm, onto another part of the second metal layer side of the intermediary web structure. In certain embodiments, however, the RF capacitor may be folded back onto the RF coil on the first metal layer side of the intermediary web structure. Once the RF capacitor is folded, a liner is adhered 415 over the second metal layer side of the intermediary web structure to secure and protect the folded RF capacitor. In other embodiments, the RF capacitor may be die cut and folded back onto a part of the first metal layer side of the intermediary web structure prior to adhering the base layer to the first metal layer side of the intermediary web structure.

After adhering 415 the liner over the second metal layer side of the intermediary web structure, a second liner may be adhered 417 over the base layer on the first metal layer side of the intermediary web structure. Either or both of the first and second liners may be a carrier layer, such as a paper, a film, or a release liner, or any other liner deemed appropriate as a surface layer covering the dual tag. In certain embodiments, depending upon the choice or materials for the base layer, the second liner may be omitted.

In alternative embodiments, cutting and folding the RF capacitor may occur prior to adhering the base layer to the first metal layer side of the intermediary web structure. In such alternative embodiments, the RF capacitor may be folded onto either the first or second metal layer sides of the intermediary web structure. As previously indicated, some of the steps described herein may require minor modifications in the event that they are performed in a different order than shown in the figures.

While the invention has been described with respect to specific examples including presently preferred modes of carrying out the invention, those skilled in the art will appreciate that there are numerous variations and permutations of the above described systems and techniques. It is to be understood that other embodiments may be utilized and structural and functional modifications may be made without departing from the scope of the present invention. Thus, the spirit and scope of the invention should be construed broadly as set forth in the appended claims.

What is claimed is:

1. A process for manufacturing a dual tag, the process comprising:
   providing a web structure having a dielectric layer between a first metal layer and a second metal layer;

depositing a first resist on the first metal layer, wherein deposition of the first resist on the first metal layer defines a radio frequency (RF) coil and a first electrode of an RF capacitor;

depositing the first resist on the second metal layer, wherein deposition of the first resist on the second metal layer defines a second electrode of the RF capacitor;

depositing a second resist on the second metal layer, wherein deposition of one of the first resist or the second resist on the second metal layer defines at least one of a far field antenna and a near field antenna; and etching the first and second metal layers to form the RF coil, the RF capacitor, the far field antenna, and the near field antenna.

2. The process of claim 1, wherein the first resist and the second resist each comprise a common resist material, and removing at least the second resist includes removing the common resist material.

3. The process of claim 1, wherein the first metal layer has a first thickness and the second metal layer has a second thickness, the first thickness being greater than the second thickness.

4. The process of claim 1, wherein the second resist comprises a removable resist ink that is easier to remove than the first resist.

5. The process of claim 1, wherein the web structure further defines a peripheral wall surrounding at least one of the RF coil, the far field antenna, and the near field antenna.

6. The process of claim 5, wherein the peripheral wall includes at least one break in the peripheral wall.

7. The process of claim 5, wherein the peripheral wall includes a plurality of spaced apart blocks positioned within the peripheral wall.

8. The process of claim 5, wherein the peripheral wall includes an inner peripheral surface, and finger structures formed from at least one of the first metal surface and the second metal surface extend from the inner peripheral surface to at least one of the RF coil, the near field antenna, and the far field antenna.

9. A process for manufacturing a dual tag, the process comprising:

providing a web structure having a dielectric layer between a first metal layer and a second metal layer;

depositing a first resist on the first metal layer, wherein deposition of the first resist on the first metal layer defines a radio frequency (RF) coil;

depositing the first resist on the second metal layer, wherein deposition of the first resist on the second metal layer defines at least one of a far field antenna and a near field antenna;

depositing a second resist on at least one of the first metal layer or the second metal layer, wherein deposition of the second resist defines a connection pad; and etching the first and second metal layers to form the RF coil, the far field antenna, the near field antenna, and the connection pad.

10. The process of claim 9, wherein both the near field antenna and the connection pad are positioned either on the first metal layer or the second metal layer.

11. The process of claim 9, wherein a chip is adhesively applied to the connection pad, and at least one of heat and pressure is used to cure the adhesive such that a bond is created between the connection pad and the chip.

12. The process of claim 9, wherein the first metal layer has a first thickness and the second metal layer has a second thickness, the first thickness being greater than the second thickness.

13. The process of claim 9, wherein the second resist comprises a removable resist ink that is easier to remove than the first resist.

14. The process of claim 9, wherein the etching step includes forming the near field antenna and the far field antenna at substantially a same time.

15. The process of claim 9, wherein the web structure further defines a peripheral wall surrounding at least one of the RF coil, the far field antenna, and the near field antenna.

16. The process of claim 15, wherein the peripheral wall includes at least one break.

17. The process of claim 15, wherein the peripheral wall includes a plurality of spaced apart blocks.

18. A method, comprising:

providing a web structure having a dielectric layer between a first metal layer and a second metal layer;

defining a plurality of tag areas across the web structure, wherein each of the plurality of tag areas is separated from another of the plurality of tag areas by a web matrix area, and within each of the plurality of tag areas:

depositing a first resist on the first metal layer, wherein deposition of the first resist on the first metal layer defines a radio frequency (RF) coil;

depositing a second resist on the second metal layer, wherein deposition of the second resist on the second metal layer defines at least one of a far field antenna and a near field antenna;

depositing at least one of the first resist or the second resist over portions of the web matrix area to define a peripheral wall around each of the tag areas;

etching the first and second metal layers to form individual tags, each of the individual tags including the RF coil, the far field antenna, and the near field antenna.

19. The method of claim 18, wherein the peripheral wall includes at least one of a break in the peripheral wall and a plurality of spaced apart blocks positioned within the peripheral wall.

20. The method of claim 18, wherein the etching step includes forming the near field antenna and the far field antenna at substantially a same time.

* * * * *